(12) United States Patent
Ivanov et al.

(10) Patent No.: US 8,362,444 B2
(45) Date of Patent: *Jan. 29, 2013

(54) PLASMA RADIATION SOURCE, METHOD OF FORMING PLASMA RADIATION, APPARATUS FOR PROJECTING A PATTERN FROM A PATTERNING DEVICE ONTO A SUBSTRATE AND DEVICE MANUFACTURING METHOD

(75) Inventors: Vladimir Vitalevitch Ivanov, Moscow (RU); Vadim Yevgenyevich Banine, Helmond (NL); Konstantin Nikolaevitch Koshelev, Troitsk (RU)

(73) Assignee: ASML Netherlands B.V., Veldhoven (NL)

( * ) Notice: Subject to any disclaimer, the term of this patent is extended or adjusted under 35 U.S.C. 154(b) by 11 days.

This patent is subject to a terminal disclaimer.

(21) Appl. No.: 12/907,135

(22) Filed: Oct. 19, 2010

(65) Prior Publication Data
US 2011/0031866 A1    Feb. 10, 2011

Related U.S. Application Data

(63) Continuation of application No. 11/638,670, filed on Dec. 14, 2006, now Pat. No. 7,838,853.

(51) Int. Cl.
*G21K 5/00* (2006.01)
(52) U.S. Cl. ............. 250/423 R; 250/424; 250/396 R; 250/396 ML; 315/111.21; 315/111.41; 315/111.71; 315/111.81
(58) Field of Classification Search ........... 250/423 R, 250/424, 425, 426, 423 P, 492.1, 492.3, 396 R, 250/396 ML; 315/111.01, 111.11, 111.21, 315/111.31, 111.41, 111.71, 111.81, 111.91
See application file for complete search history.

(56) References Cited

U.S. PATENT DOCUMENTS

| 4,906,890 A | 3/1990 | Miljevic ............... 313/156 |
| 6,408,052 B1 * | 6/2002 | McGeoch ............. 378/119 |
| 6,417,604 B1 * | 7/2002 | Hartmann et al. ..... 313/155 |
| 7,838,853 B2 * | 11/2010 | Ivanov et al. ........ 250/493.1 |
| 2001/0004104 A1 | 6/2001 | Bijkerk et al. ....... 250/492.2 |
| 2002/0021430 A1 | 2/2002 | Koshelev et al. ...... 355/53 |
| 2002/0145389 A1 | 10/2002 | Bugrova et al. ...... 315/111.81 |
| 2003/0142280 A1 * | 7/2003 | Bakker et al. ......... 355/53 |

(Continued)

FOREIGN PATENT DOCUMENTS

| EP | 0 264 054 A2 | 4/1988 |
| JP | 58-121598 A | 7/1983 |
| JP | 59-198647 A | 11/1984 |
| JP | 11-339726 A | 12/1999 |
| JP | 2006-158359 A | 6/2006 |

OTHER PUBLICATIONS

Written Opinion for International Application No. PCT/NL2007/050652, dated Jun. 16, 2009.

*Primary Examiner* — David A Vanore
*Assistant Examiner* — Nicole Ippolito
(74) *Attorney, Agent, or Firm* — Pillsbury Winthrop Shaw Pittman LLP

(57) ABSTRACT

A patterned beam of radiation is projected onto a substrate. A reflective optical element is used to help form the radiation beam from radiation emitted from a plasma region of a plasma source. In the plasma source, a plasma current is generated in the plasma region. To reduce damage to the reflective optical element, a magnetic field is applied in the plasma region with at least a component directed along a direction of the plasma current. This axial magnetic field helps limit the collapse of the Z-pinch region of the plasma. By limiting the collapse, the number of fast ions emitted may be reduced.

26 Claims, 3 Drawing Sheets

U.S. PATENT DOCUMENTS

2004/0105082 A1* 6/2004 Koshelev et al. ............... 355/53
2006/0232215 A1* 10/2006 Bogatu .................... 315/111.31
2008/0068575 A1 3/2008 Murakami ..................... 355/67
2008/0142740 A1 6/2008 Ivanov et al. ............ 250/492.21

* cited by examiner

PLASMA RADIATION SOURCE, METHOD OF FORMING PLASMA RADIATION, APPARATUS FOR PROJECTING A PATTERN FROM A PATTERNING DEVICE ONTO A SUBSTRATE AND DEVICE MANUFACTURING METHOD

This application is a continuation of U.S. patent application Ser. No. 11/638,670, filed Dec. 14, 2006, now U.S. Pat No. 7,838,853 now allowed, which is incorporated herein in its entirety by reference.

FIELD

The present invention relates to a plasma radiation source, an apparatus for forming a beam of radiation using a plasma radiation source, which apparatus is a lithographic apparatus in an embodiment, a method of forming plasma radiation and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

U.S. patent application publication US 2004-0105082 describes the use of a plasma source to produce radiation for use to form a patterned beam to transfer a pattern to a substrate. In an embodiment, it is described how the Z-pinch effect of plasma affects the production of radiation. Briefly, Z-pinch involves the interaction of plasma current and the azimuthal magnetic field induced by that plasma current (i.e. the magnetic field directed tangentially to a circle in a plane perpendicular to the plasma current). The azimuthal magnetic field causes a force on the plasma carried discharge current. This force is directed to the central axis of the discharge. As a result, the plasma with current is compressed (pinched) and the intensity of radiation from the plasma is raised due to increased Joule heating of the pinched area. This radiation may be suitable for EUV lithography.

In an EUV lithographic apparatus, reflective elements (e.g., mirrors shaped to have a focusing effect, etc.) are used to form a beam from the radiation emitted by the Z-pinch plasma current, to illuminate the patterning device with the beam and to project the patterned beam from the patterning device onto the substrate.

Apart from the EUV radiation, the Z-pinch plasma also emits fast ions. Unfortunately, these fast ions may cause damage to the reflective elements in such a lithographic apparatus.

SUMMARY

It is desirable, for example, to reduce damage caused to optical elements in a lithographic apparatus that uses Z-pinch plasma to generate a beam of radiation.

According to an aspect of the invention, there is provided a plasma radiation source comprising an anode and a cathode defining a region in which to produce a plasma current between the anode and the cathode, and a magnet configured to produce a magnetic field in the region with at least a component directed along a direction of the plasma current between the anode and the cathode.

According to an aspect of the invention, there is provided an apparatus for projecting a pattern from a patterning device onto a substrate, the apparatus comprising:

a plasma radiation source comprising an anode and a cathode defining a region in which to produce a plasma current between the anode and the cathode, and a magnet configured to produce a magnetic field in the region with at least a component directed along a direction of the plasma current between the anode and the cathode; and an illumination system configured to form a radiation beam from radiation emitted from the region.

According to an aspect of the invention, there is a provided a method of producing radiation, comprising:

generating a plasma current in a plasma region;

applying a magnetic field in the plasma region with at least a component directed along a direction of the plasma current; and emitting radiation from the plasma region.

According to an aspect of the invention, there is provided a device manufacturing method comprising projecting a patterned beam of radiation onto a substrate, the method comprising:

generating a plasma current in a plasma region;

applying a magnetic field in the plasma region with at least a component directed along a direction of the plasma current; and using a reflective optical element to form a radiation beam from radiation emitted from the plasma region.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
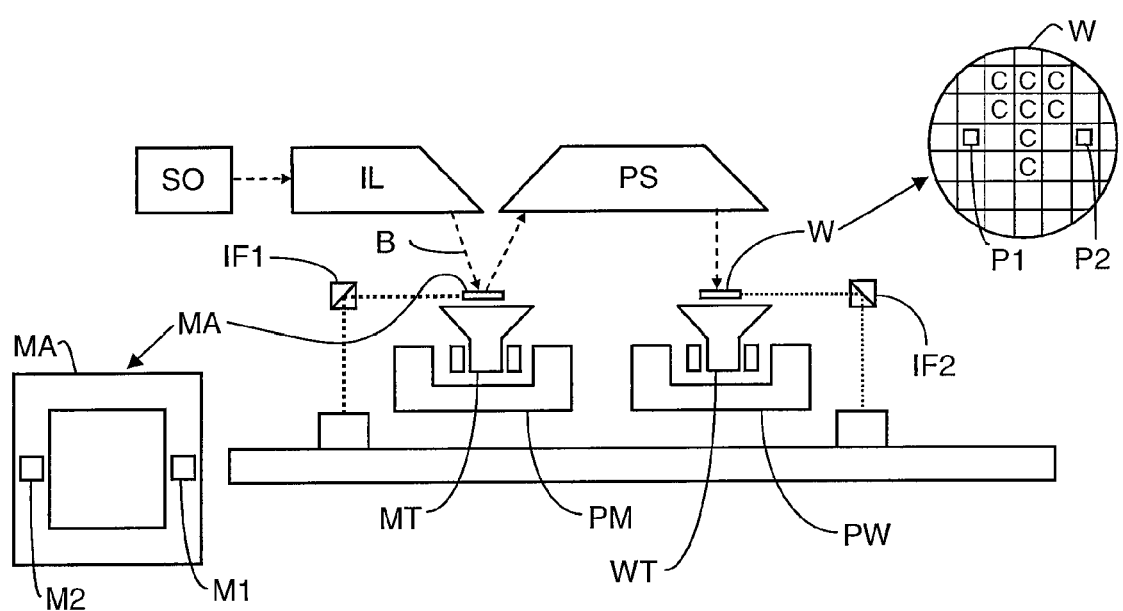
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a reflective projection system) PS configured to project a pattern imparted to the radiation beam B by patterning device. MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structures are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The illuminator IL may comprise an adjuster configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
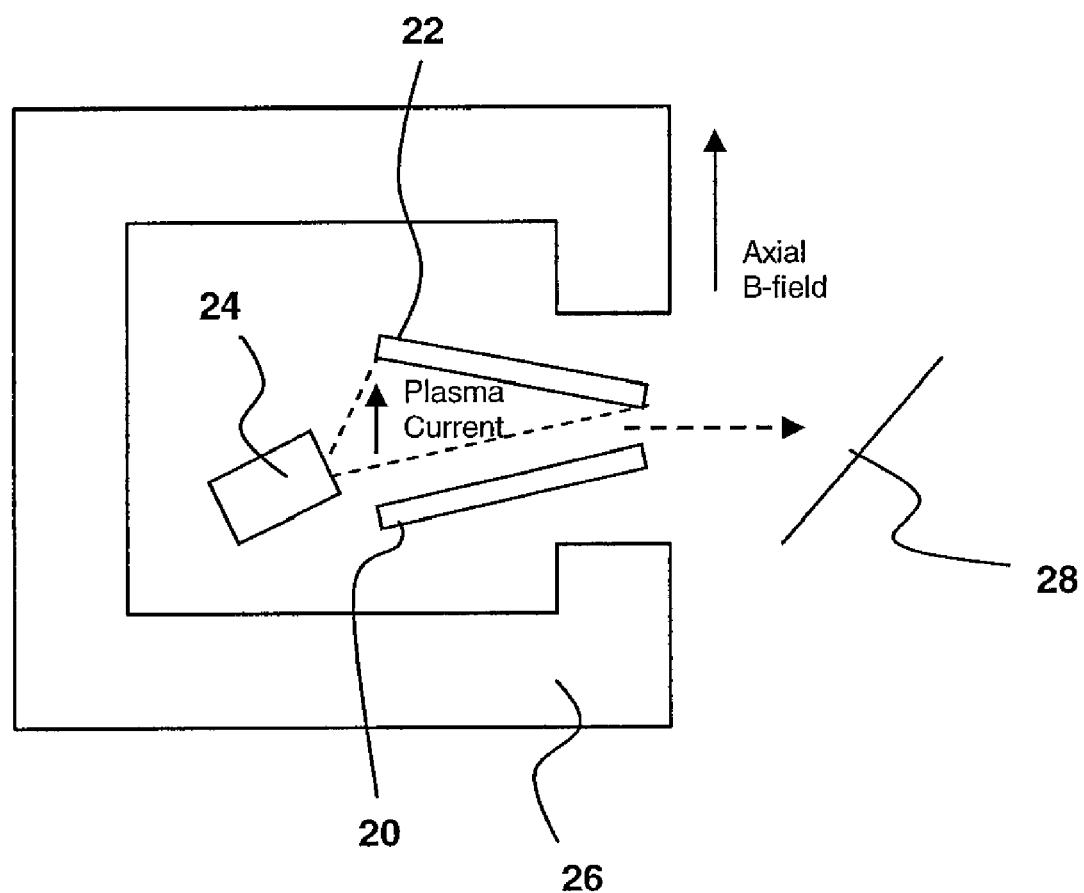
FIG. 2 illustrates a radiation source.

FIG. 2 shows part of a Z-pinch plasma radiation source SO. The source comprises an anode 20, a cathode 22, a laser 24 and a permanent magnet 26. In addition, a first reflective element (e.g., lens) 28 of an illumination system is symbolically shown. Anode 20 and cathode 22 may be rotatable discs, driven by a motor (not shown). For the sake of illustration, permanent magnet 26 is shown in a horse-shoe type of shape, but it should be appreciated that any shape may be used. Permanent magnet 26 is located to generate a magnetic field directed substantially parallel to the direction of plasma current in a region between anode 20 and cathode 22. Laser 24 is directed at cathode 22, which comprises tin (Sn).

In operation, an electric field is applied between anode 20 and cathode 22 with a sufficient strength to provide for generation of a plasma. The conditions for this are known per se. Laser 24 is used to irradiate cathode 22 or anode 20, with an intensity that has the effect of causing evaporation of tin from cathode 22 or anode 20 to the region between anode 20 and cathode 22. This method of triggering is describe in more detail in U.S. patent application publication no. US 2004-0105082, incorporated herein in its entirety by reference. The electric field in the region between anode 20 and cathode 22 causes plasma current between the anode 20 and cathode 22 through the region. The plasma in the current emits EUV radiation in the direction of first reflective element 28 (among other elements). First reflective element 28 reflects this radiation into the illumination system, from where the radiation is applied to the patterning device MA (not shown) and projected onto the substrate W (not shown).

In the region of the plasma current, the Z-pinch effect occurs, which heats and concentrates the plasma current, with the effect of intensifying the radiation and lowering the wavelength of maximum radiation intensity. The Z-pinch effect is the result of the azimuthal magnetic field induced by the discharge current, i.e. with magnetic field lines that encircle the discharge current from anode 20 to cathode 22. Without an axial magnetic field, the plasma would continue to shrink until the moment when the pressure due to the azimuthal magnetic field is compensated by the internal plasma pressure. This condition is known as the Bennett equilibrium. Although this is a desirable effect as far as the emitted radiation is concerned, the Z-pinch has an undesirable side effect that more fast ions are emitted as well. These fast ions may cause damage to the first reflective element 28 and in some cases also to other parts, for example, in the illumination system. Deep plasma compression and hence small plasma cross-section results in high ohmic resistance R of the plasma. Nevertheless, total inductance of the discharge circuit maintains the current value I thus leading to an essential increase of a voltage drop $U=I*R$ in a discharge gap. Ions with an effective charge Z can be accelerated by such a field up to kinetic energy $E=Z*U$. For example, at a current value $I=20$ kA and a plasma resistance $R=0.1$-$1$ Ohm, ions with $Z=10$ with kinetic energy up to 20-200 keV may be expected.

Magnet 26 is provided to reduce the number of emitted fast ions. Magnet 26 provides an axial magnetic field directed along the direction of the plasma current. It is proposed to use a magnetic field strength in or selected from a range of 0.01 to 1 Tesla, for example. The magnetic field from magnet 26 is captured by the plasma and compressed together with the pinching of the plasma. This results in additional internal pressure in the plasma which in turn terminates plasma compression earlier than it would be without an initial axial magnetic field.

At a larger cross-section plasma, ohmic resistance is lower thus causing the appearance of a lower electrical voltage drop and a lower kinetic energy of emitted ions. In this way, the number of emitted fast ions is also limited. By using an added axial magnetic field, the collapse of the Z-pinch region is limited and the number of fast ions emitted is reduced or eliminated. Desirably, an external (initial) axial magnetic field strength of at least 0.01 Tesla is applied in the region where the plasma will be generated in order to produce a significant limitation of the collapse. An external axial magnetic field strength of 0.02 Tesla may be an effective value. Moreover, at an external axial magnetic field strength that is not excessively strong (for example less than 1 Tesla), the emission of EUV radiation may not be significantly reduced, so that the source remains suitable for use in lithography.

Figure 3:
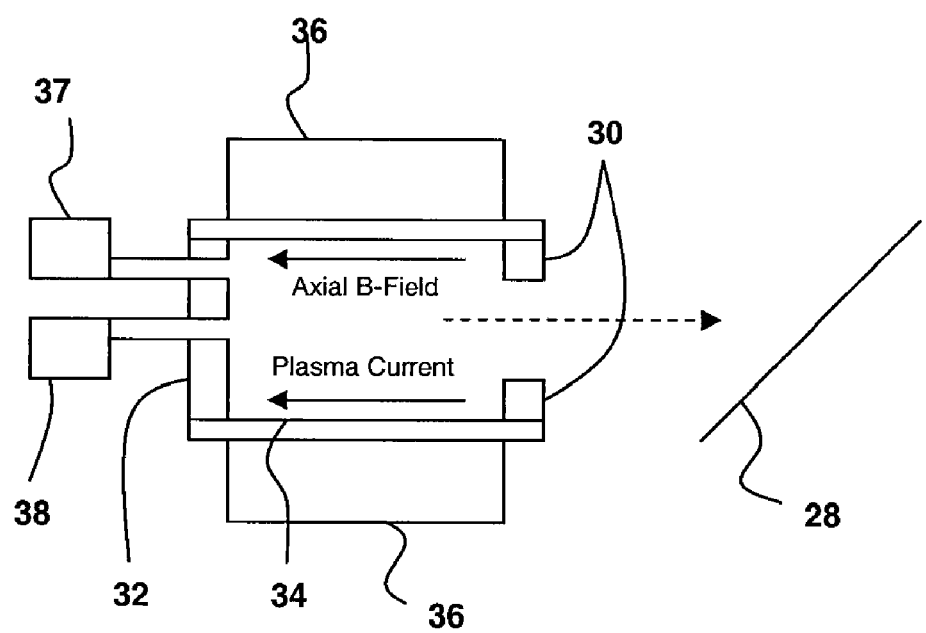
FIG. 3 illustrates a radiation source.

FIG. 3 shows part of another Z-pinch plasma radiation source SO. Herein an annular anode 30 and an annular cathode 32 are used in a chamber 34 with an isolating wall. Windings 36 of an electromagnet are provided around the chamber 34. Gas sources 37, 38 are provided, coupled to cathode 32, to supply pre-ionized gas and a driver gas respectively into the region between anode 30 and cathode 32.

In operation, ionized gas is fed into the chamber in the region between anode 30 and cathode 32. In combination with the electric field between anode 30 and cathode 32, this leads to a plasma current in the chamber 34. The plasma current contracts due the Z-pinch effect. The plasma radiates EUV radiation through the opening in annular anode 30 to first reflective element 28 of, for example, the illumination system. An electric current is applied through windings 36 to induce an axial magnetic field, directed along discharge current direction from anode 30 to cathode 32. The axial magnetic field reduces the contraction of the plasma current.

It will be appreciated that the same effect can be realized with various different configurations. For example, although desirably the magnetic field from the external magnet 26 is strictly axial in the plasma current region, a magnetic field with field vectors with components in non-axial directions in the plasma regions may be used as well, as long as there is an axial component. Hence, one or more magnets may be located at a position other than the ones shown in the examples. Although examples of use of a permanent magnet and an electromagnet have been shown, it should be appreciated that a combination of a permanent magnet and an electromagnet may be used, or that the electromagnet may be provided with a magnetizable element to concentrate the magnetic field. A permanent magnet may be used instead of an electromagnet or vice versa.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A plasma radiation source comprising:
an anode and a cathode defining a region in which to produce a plasma current, wherein the anode has a first surface and a first periphery and the cathode has a second surface with a second periphery which faces the first surface of the anode such that the anode and the cathode do not overlap each other; and
a magnet that is a physically separate structure from the anode and cathode, the magnet disposed substantially around the anode and the cathode to externally induce a magnetic field in a discharge gap between the anode and the cathode, the magnet having a third periphery that does not overlap the first periphery of the first surface of the anode and/or the second periphery of the second surface of the cathode and the magnetic field in the region having an axial component directed along a direction of the plasma current.

2. The plasma radiation source of claim 1, further comprising a beam forming system configured to form a radiation beam from radiation emitted from the region.

3. The plasma radiation source of claim 1, wherein the magnet is configured to apply the magnetic field with a strength in a range of 10 milli-Tesla to 100 milli-Tesla in the region and wherein the anode and cathode are a solid disc or a solid ring.

4. The plasma radiation source of claim 1, wherein the direction of the plasma current is from the anode to the cathode and the magnetic field is of a sufficient strength to limit the collapse of a Z-pinch region of the plasma.

5. The plasma radiation source of claim 1, wherein the magnet is a permanent magnet and wherein the first surface of the anode is a first major annular surface and the second surface of the cathode is a second major annular surface.

6. The plasma radiation source of claim 1, wherein a plane of the magnet, the plane defined at least in part by the third periphery, does not overlap the first surface of the anode and/or the second surface of the cathode.

7. The plasma radiation source of claim 1, wherein the first surface of the anode, the second surface of the cathode and the magnet are disposed such that the first, second and third peripheries are located adjacent to each other with the third periphery between the first and second peripheries.

8. An apparatus to project a pattern from a patterning device onto a substrate, the apparatus comprising:
a plasma radiation source comprising:
an anode and a cathode defining a region in which to produce a plasma current, wherein the anode has a first major annular surface with a first periphery and the cathode has a second major annular surface with a second periphery which second major annular surface is facing the first major annular surface of the anode such that the anode and the cathode do not overlap each other, and
a magnet that is a physically separate structure from the anode and cathode, the magnet disposed substantially around the anode and the cathode to externally induce a magnetic field in a discharge gap between the anode and the cathode, the magnet having a third periphery that does not overlap the first periphery of the first major annular surface of the anode and/or the second periphery of the second major annular surface of the cathode and the magnetic field in the region having an axial component directed along a direction of the plasma current; and
an illumination system configured to form a radiation beam from radiation emitted from the region.

9. The apparatus of claim 8, wherein the magnet is configured to apply the magnetic field with a strength in a range of 10 milli-Tesla to 100 milli-Tesla in the region and wherein the anode and cathode are a solid disc or a solid ring.

10. The apparatus of claim 8, wherein the direction of the plasma current is from the anode to the cathode and the magnetic field is of a sufficient strength to limit the collapse of a Z-pinch region of the plasma.

11. The apparatus of claim 8, wherein the magnet is a permanent magnet.

12. The apparatus of claim 8, further comprising:
a support constructed to support a patterning device, the patterning device being capable of imparting the radiation beam with a pattern in its cross-section to form a patterned radiation beam;
a substrate table constructed to hold a substrate; and
a projection system configured to project the patterned radiation beam onto a target portion of the substrate.

13. The apparatus of claim 8, wherein a plane of the magnet, the plane defined at least in part by the third periphery, does not overlap the first major annular surface of the anode and/or the second major annular surface of the cathode.

14. The apparatus of claim 8, wherein the first major annular surface of the anode, the second major annular surface of the cathode and the magnet are disposed such that the first, second and third peripheries are located adjacent to each other with the third periphery between the first and second peripheries.

15. A method of producing radiation, comprising:
generating a plasma current in a plasma region in a direction between an anode and a cathode;
applying a magnetic field in the plasma region with an axial component directed along the direction of the plasma current; and
emitting radiation from the plasma region,
wherein the anode has a first major annular surface with a first periphery, the cathode has a second major annular surface with a second periphery which second major annular surface faces the first major annular surface of the anode such that the anode and the cathode do not overlap each other, and a magnet, that is a physically separate structure from the anode and cathode, is disposed substantially around the anode and the cathode to externally induce the magnetic field in a discharge gap between the anode and the cathode, the magnet having a third periphery that does not overlap the first periphery of the first major annular surface of the anode and/or the second periphery of the second major annular surface of the cathode.

16. The method of claim 15, wherein the magnetic field is externally applied with a strength in a range of 10 milli-Tesla to 100 milli-Tesla in the plasma region and wherein the anode and cathode are a solid disc or a solid ring.

17. The method of claim 15, wherein the magnetic field is of a sufficient strength to limit the collapse of a Z-pinch region of the plasma, wherein the direction of the plasma current is from the anode to the cathode and wherein the magnet is a permanent magnet.

18. The method of claim 15, further comprising imparting the radiation beam with a pattern in its cross-section to form a patterned radiation beam and projecting the patterned radiation beam onto a target portion of a substrate.

19. The method of claim 15, further comprising forming a radiation beam from emitted radiation from the plasma region.

20. The method of claim 15, wherein a plane of the magnet, the plane defined at least in part by the third periphery, does not overlap the first major annular surface of the anode and/or the second major annular surface of the cathode.

21. The method of claim 15, wherein the first major annular surface of the anode, the second major annular surface of the cathode and the magnet are disposed such that the first, second and third peripheries are located adjacent to each other with the third periphery between the first and second peripheries.

22. A device manufacturing method comprising:
applying a magnetic field in a plasma region with an axial component directed along the direction of a plasma current;
following applying the magnetic field, generating the plasma current in the plasma region in a direction between an anode and a cathode; and
using a reflective optical element to form a radiation beam from radiation emitted from the plasma region,
wherein the anode has a first major annular surface, the cathode has a second major annular surface which faces the first major annular surface of the anode such that the anode and the cathode do not overlap each other, and a magnet is disposed substantially around the anode and the cathode to externally induce the magnetic field in a discharge gap between the anode and the cathode.

23. The method of claim 22, wherein the magnetic field is externally applied with a strength in a range of 10 milli-Tesla to 100 milli-Tesla in the plasma region and wherein the anode and cathode are a solid disc or a solid ring.

24. The method of claim 22, wherein the initial magnetic field is of a sufficient strength to limit the collapse of a Z-pinch region of the plasma and the magnet is a permanent magnet.

25. The method of claim 22, further comprising imparting the radiation beam with a pattern in its cross-section to form a patterned radiation beam and projecting the patterned radiation beam onto a target portion of a substrate.

26. A plasma radiation source comprising:
an anode and a cathode defining a region in which to produce a plasma current, wherein the anode is an annular anode having a first major annular surface and the cathode is an annular cathode having a second major annular surface which faces the first major annular surface of the annular anode such that the annular anode and the annular cathode do not overlap each other; and
a permanent magnet or an electromagnet magnet not directly electrically connected to the anode or cathode, configured to induce an initial magnetic field of a sufficient strength in a discharge gap between the annular anode and the annular cathode such as to limit the collapse of a Z-pinch region of the plasma, wherein the magnetic field in the region has an axial component directed along a direction of the plasma current.

* * * * *